(12) United States Patent
Li et al.

(10) Patent No.: US 12,724,387 B2
(45) Date of Patent: Sep. 1, 2026

(54) DRIVING METHOD, APPARATUS, AND SLIDING-ROLLABLE DISPLAY DEVICE

(71) Applicants: Chengdu BOE Optoelectronics Technology Co., Ltd., Chengdu (CN); BOE Technology Group Co., Ltd., Beijing (CN)

(72) Inventors: Yuanjie Li, Beijing (CN); Sitong Chen, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 400 days.

(21) Appl. No.: 18/291,301

(22) PCT Filed: Mar. 29, 2023

(86) PCT No.: PCT/CN2023/084593
§ 371 (c)(1),
(2) Date: Jan. 23, 2024

(87) PCT Pub. No.: WO2024/197620
PCT Pub. Date: Oct. 3, 2024

(65) Prior Publication Data

US 2025/0116979 A1 Apr. 10, 2025

(51) Int. Cl.
*G05B 15/02* (2006.01)
*H05K 5/02* (2006.01)
(Continued)

(52) U.S. Cl.
CPC .......... *G05B 15/02* (2013.01); *H05K 5/0217* (2013.01); *E06B 2009/6845* (2013.01); *G01D 5/145* (2013.01)

(58) Field of Classification Search
CPC ............... E06B 2009/6845; E06B 9/68; E06B 2009/407; E06B 9/40; E06B 9/42;
(Continued)

(56) References Cited

U.S. PATENT DOCUMENTS 6,082,433 A * 7/2000 Vafaie ...................... E06B 9/68 160/310
12,602,201 B1 * 4/2026 Delfeld .................... G06F 7/57
(Continued)

FOREIGN PATENT DOCUMENTS

CN 106448465 A 2/2017
CN 107369382 A 11/2017
(Continued)

*Primary Examiner* — Beth A Aubrey
(74) *Attorney, Agent, or Firm* — WHDA, LLP

(57) ABSTRACT

Driving method, apparatus, and sliding-rollable display device are disclosed. The sliding-rollable display device includes a movable housing, a driving motor and a flexible display screen, at least a portion of which covers the movable housing. The driving motor drives the movable housing to move between first and second positions, the first position is a position of the movable housing when the sliding-rollable display device is fully rolled and the second position is a position of the movable housing when the sliding-rollable display device is fully unrolled. A sensing element is provided on the movable housing, sensing modules are arranged at the first and second positions for detecting the sensing element. The driving motor is controlled to drive the movable housing to move to the first or second position, and to stop driving the movable housing when a first timer expires.

20 Claims, 3 Drawing Sheets

(51) Int. Cl.
*E06B 9/68* (2006.01)
*G01D 5/14* (2006.01)

(58) Field of Classification Search
CPC ..... E06B 2009/6809; E06B 2009/6872; E06B 2009/6881; E06B 2009/689; G05B 15/02; H05K 5/0217; G01D 5/145
See application file for complete search history.

(56) References Cited

U.S. PATENT DOCUMENTS

2017/0318693 A1 11/2017 Kim et al.
2019/0119984 A1* 4/2019 Mugnier ............. E04F 10/0659
2022/0228420 A1* 7/2022 Gregoriou ................. E06B 9/68
2023/0151690 A1* 5/2023 Menendez ................ E06B 9/42 318/255
2023/0203876 A1* 6/2023 Gregoriou ................. E06B 9/68 160/7
2024/0102341 A1* 3/2024 Childress .................. E06B 9/68
2024/0151102 A1* 5/2024 Sweitzer ................. E06B 9/322
2024/0279957 A1* 8/2024 Ahn ......................... B60J 3/002

FOREIGN PATENT DOCUMENTS

CN 111104086 A * 5/2020 ............. G06F 3/147
CN 112947687 A 6/2021
CN 113539098 A 10/2021
CN 115148137 A 10/2022
CN 115273675 A 11/2022
CN 115331568 A 11/2022
KR 102359550 B1 * 2/2022 ............... G06F 3/14
KR 20220061816 A 5/2022
KR 20220065643 A 5/2022
KR 102560664 B1 * 7/2023 ............... G06F 3/01

* cited by examiner

DRIVING METHOD, APPARATUS, AND SLIDING-ROLLABLE DISPLAY DEVICE

CROSS-REFERENCE TO RELATED APPLICATIONS

The present application is the U.S. national phase of PCT Application No. PCT/CN2023/084593 filed on Mar. 29, 2023, which is hereby incorporated by reference in its entirety.

TECHNICAL FIELD

The present disclosure relates to the technical field of displaying, and in particular, to a driving method, an apparatus, and a sliding-rollable display device.

BACKGROUND

At present, with the developing of OLED (Organic Light Emission Diode) displaying technology in recent years, more and more attention has been paid to new flexible display products and research. The flexible display screen has advantages such as bendable, rollable and the like, using which the display device can be rolled or folded. This can facilitate a user to carry or use the display device. A sliding-rollable design, which combines folding and rolling, is more advantageous in its appearance and applicability.

The sliding-rollable product is another innovative field for the flexible display panel. The sliding-rollable design enable the user to randomly switch a display area of the flexible display panel according to actual needs. The sliding-rollable product is not only convenient for the user to carry the display panel with him or her, but also provides the user with a better user experience than the foldable display panel. Therefore, the sliding-rollable design is an important direction for developing the flexible display panel development.

SUMMARY

The present disclosure is to provide a driving method, an apparatus, and a sliding-rollable display device, which can improve the user experience for the sliding-rollable display device.

In order to achieve this, embodiments of the present disclosure provide the following technical solutions.

In an aspect, a driving method is provided, the driving method is applied to a sliding-rollable display device, where the sliding-rollable display device includes a movable housing, a driving motor, and a flexible display screen; at least a portion of the flexible display screen covers the movable housing, the driving motor is configured to drive the movable housing to move between a first position and a second position, where the first position is a position of the movable housing when the sliding-rollable display device is fully rolled, and the second position is a position of the movable housing when the sliding-rollable display device is fully unrolled; a sensing element is provided on the movable housing, sensing modules are provided at the first position and the second position for detecting the sensing element. The driving method includes:

- controlling the driving motor to drive the movable housing to move to the first position or the second position;
- starting a first timer when a first sensing signal from the sensing modules is received; and
- controlling the driving motor to stop driving the movable housing to move when the first timer expires;
- where the first sensing signal indicates that the movable housing is located at a third position between the first position and the second position, and a duration of the first timer is determined by a first distance and a moving speed of the movable housing, the first distance is a distance between the third position and the first position, or a distance between the third position and the second position.

In some embodiments, the method further includes:

- obtaining a second duration for the movable housing to move from the first position to the second position;
- starting a second timer when the driving motor drives the movable housing to move, a duration of the second timer is the second duration; and
- controlling the driving motor to stop driving the movable housing to move when the second timer expires.

In some embodiments, the method further includes:

- stopping the second timer when the first timer expires.

In some embodiments, the method further includes:

- obtaining a moving speed of the movable housing, which includes:
- obtaining a plurality of groups of historical data, each group of historical data including an ambient temperature, a first time point and a second time point that are corresponding to the ambient temperature, where the first time point is a time point when the driving motor starts to drive the movable housing to move, and the second time point is a time point when the first sensing signal from the sensing modules is received;
- dividing, according to the ambient temperature, the plurality of groups of historical data into historical data sets corresponding to a plurality of different temperature ranges;
- determining a standard moving speed for each historical data set, according to the first time point, the second time point and the first distance in groups of historical data included in the historical data set, the first distance is the distance between the third position and the first position, or the distance between the third position and the second position; and
- obtaining a current ambient temperature, and determining a standard moving speed for a historical data set, which is corresponding to a temperature range within which the current ambient temperature is located, as the moving speed of the movable housing.

In some embodiments, obtaining the second duration includes:

- obtaining a second distance between the first position and the second position; and
- determining the second duration according to the second distance and a moving speed of the movable housing.

In some embodiments, obtaining the second duration includes:

- obtaining a plurality of groups of historical data, each group of historical data including an ambient temperature, a first time point and a third time point that are corresponding to the ambient temperature, where the first time point is a time point when the driving motor starts to drive the movable housing to move, and the third time point is a time point when the driving motor stops driving the movable housing to move;
- dividing, according to the ambient temperature, the plurality of groups of historical data into historical data sets corresponding to a plurality of different temperature ranges;

determining a standard second duration for each historical data set, according to the first time point and the third time point in groups of historical data within the historical data set; and obtaining a current ambient temperature, and determining a standard second duration for a historical data set, which is corresponding to a temperature range within which the current ambient temperature is located, as the second duration.

Embodiments of the present disclosure further provide a driving apparatus, applied to a sliding-rollable display device, where the sliding-rollable display device includes a movable housing, a driving motor, and a flexible display screen, at least a portion of the flexible display screen covers the movable housing, the driving motor is configured to drive the movable housing to move between a first position and a second position, where the first position is a position of the movable housing when the sliding-rollable display device is fully rolled, and the second position is a position of the movable housing when the sliding-rollable display device is fully unrolled; a sensing element is provided on the movable housing, and sensing modules are provided at the first position and the second position for detecting the sensing element. The driving apparatus includes:

a driving module, configured to control the driving motor to drive the movable housing to move to the first position or the second position;

a first starting module, configured to start a first timer when a first sensing signal from the sensing modules is received; and a control module, configured to control the driving motor to stop driving the movable housing to move when the first timer expires;

where the first sensing signal indicates that the movable housing is located at a third position between the first position and the second position, and a duration of the first timer is determined by a first distance and a moving speed of the movable housing, the first distance is a distance between the third position and the first position, or a distance between the third position and the second position.

In some embodiments, the apparatus further includes:

an obtaining module, configured to obtain a second duration for the movable housing to move from the first position to the second position; and a second starting module, configured to start a second timer when the driving motor drives the movable housing to move, a duration of the second timer is the second duration;

the control module is further configured to control the driving motor to stop driving the movable housing to move when the second timer expires.

In some embodiments, the apparatus further includes:

a stopping module, configured to stop the second timer when the first timer expires.

In some embodiments, the apparatus further includes:

a moving speed obtaining module, configured to obtain a moving speed of the movable housing, which includes:

a first obtaining unit, configured to obtain a plurality of groups of historical data, each group of historical data including an ambient temperature, a first time point and a second time point which are corresponding to the ambient temperature, where the first time point is a time point when the driving motor starts to drive the movable housing to move, and the second time point is a time point when the first sensing signal from the sensing modules is received;

a first dividing unit, configured to divide, according to the ambient temperature, the plurality of groups of historical data into historical data sets corresponding to a plurality of different temperature ranges;

a first determination unit, configured to determine a standard moving speed for each historical data set, according to the first time point, the second time point and the first distance in groups of historical data within the historical data set, the first distance is a distance between the third position and the first position, or a distance between the third position and the second position; and a first processing unit, configured to obtain a current ambient temperature, and determine a standard moving speed for a historical data set, which is corresponding to a temperature range within which the current ambient temperature is located, as the moving speed of the movable housing.

In some embodiments, the obtaining module includes:

a second obtaining unit, configured to obtain a second distance between the first position and the second position; and a second determination unit, configured to determine the second duration according to the second distance and a moving speed of the movable housing.

In some embodiments, the obtaining module includes:

a third obtaining unit, configured to obtain a plurality of groups of historical data, each group of historical data including an ambient temperature, a first time point and a third time point which are corresponding to the ambient temperature, where the first time point is a time point when the driving motor starts to drive the movable housing to move, and the third time point is a time point when the driving motor stops driving the movable housing to move;

a second dividing unit, configured to divide, according to the ambient temperature, the plurality of groups of historical data into historical data sets corresponding to a plurality of different temperature ranges;

a third determination unit, configured to determine a standard second duration for each historical data set, according to the first time point and the third time point in groups of historical data included in the historical data set; and a second processing unit, configured to obtain a current ambient temperature, and determine a standard second duration for a historical data set, which is corresponding to a temperature range within which the current ambient temperature is located, as the second duration.

Embodiments of the present disclosure further provide a sliding-rollable display device, including a movable housing, a driving motor, and a flexible display screen, where at least a portion of the flexible display screen covers the movable housing, the driving motor is configured to drive the movable housing to move between a first position and a second position, where the first position is a position of the movable housing when the sliding-rollable display device is fully rolled, and the second position is a position of the movable housing when the sliding-rollable display device is fully unrolled; a sensing element is provided on the movable housing, sensing modules are provided at the first position and the second position for detecting the sensing element, and the sliding-rollable display device further includes the driving apparatus as described above.

In some embodiments, the sensing element is a magnet.

In some embodiments, the magnet has a central symmetric structure.

The embodiments of present disclosure has the following advantageous effects.

In the above-mentioned solutions, in response to receiving the first sensing signal indicating that the movable housing is positioned at the third position, the first timer is started, and in a case that the first timer expires, the driving motor is controlled to stop driving the movable housing to move. By controlling the driving motor according to the duration of the first timer, the position of the movable housing can be accurately controlled, to ensure a full unrolling travel and/or a full rolling travel of the sliding-rollable display device, thereby improving the user experience of the sliding-rollable display device.

REFERENCE NUMERALS

01 Movable housing
02 Flexible display screen
011 Sensing element
03 Sensing module

DETAILED DESCRIPTION

To make the technical issue to be addressed, technical solutions, and advantages provided by the embodiments of the present disclosure clear, a detailed description will be given below with reference to the accompanying drawings and specific embodiments.

Figure 1:
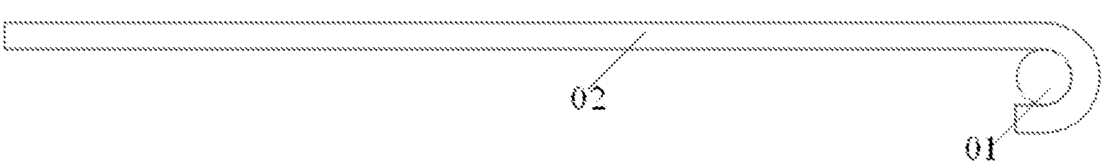
FIG. 1 is a schematic cross-sectional view of a sliding-rollable display device.
Figure 2:
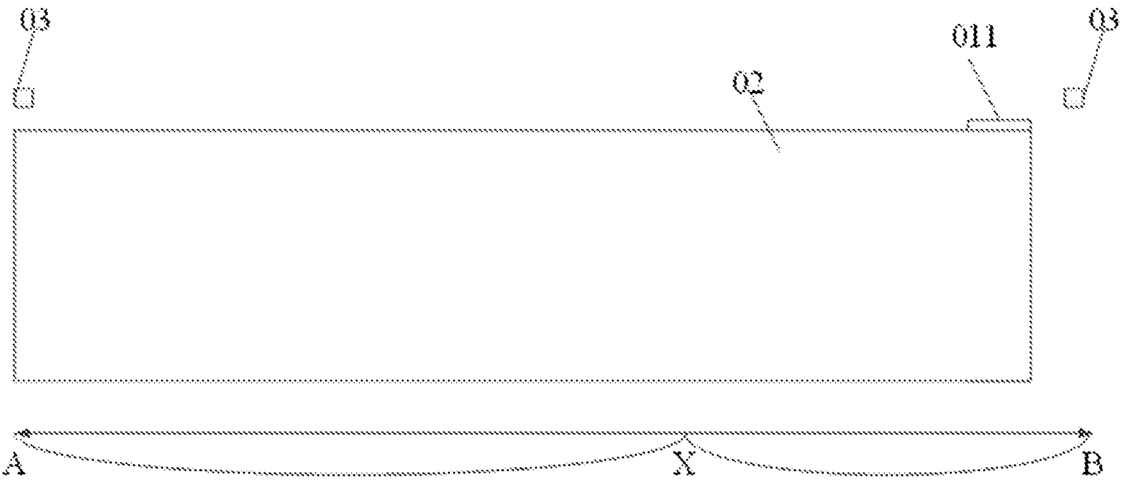
FIG. 2 is a schematic plan view of a sliding-rollable display device.

FIGS. 1 and 2 are schematic views for a sliding-rollable display device. The sliding-rollable display device includes a movable housing 01, a driving motor (not shown) and a flexible display screen 02. At least a portion of the flexible display screen 02 covers the movable housing 01. The driving motor is configured for driving the movable housing 01 to move between a first position A and a second position B. The first position A is a position where the movable housing 01 is positioned when the sliding-rollable display device is fully rolled. The second position B is a position where the movable housing 01 is located when the sliding-rollable display device is fully unrolled. When the sliding-rollable display device is unrolling, the driving motor drives the movable housing 01 to move from the first position A to the second position B, and the flexible display screen 02 is expanding as the movable housing 01 moves. When the sliding-rollable display device is rolling, the driving motor drives the movable housing 01 to move from the second position B to the first position A, and the flexible display screen 02 is drawn back as the movable housing 01 moves.

Figure 3:
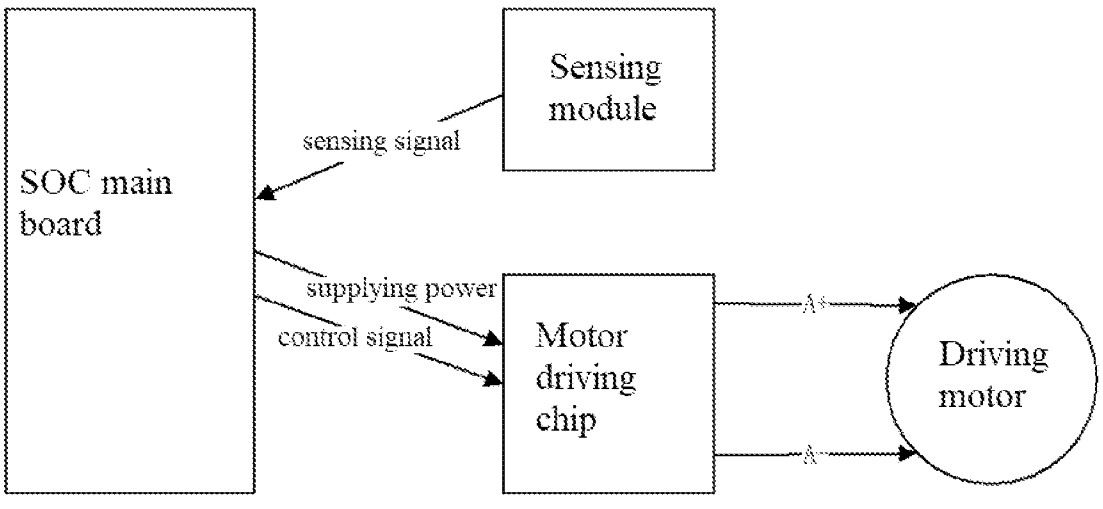
FIG. 3 is a schematic diagram showing a travel driving principle of a sliding-rollable display device.

The movable housing 01 is provided with a sensing element 011, and sensing modules 03 are provided at the first position A and the second position B for detecting the sensing element 011. As shown in FIG. 3, the sliding-rollable display device further includes a SOC (System on Chip) main board and a motor driving chip. The SOC main board provides a power supply to the motor driving chip and outputs control signals EN, INA and INB, and the SOC main board controls the driving motor via the control signals. Among others, EN is an enable signal, when a signal EN OFF is sent to the motor driving chip, the driving motor is stopped; and when the signal EN is sent to the motor drive chip, the driving motor is started. A current direction outputted by the driving motor can be controlled by the INA and INB signals, so that the direct current motor can rotate in a forward or reverse direction, thereby controlling the movable housing 01 to move towards the first position or the second position.

The sensing module is a distance sensing element or a position sensing element, for example, a Hall sensing device may be used to realize the position sensing. The SOC main board obtains travel position information of the movable housing 01 by identifying a sensing signal from the sensing modules, and controls the driving motor by the control signals. When the sliding-rollable display device is unrolling, the driving motor drives the movable housing 01 to move from the first position A to the second position B, the sensing module 03 at the second position B detects the sensing element 011, the SOC main board identifies a sensing signal S of the sensing module and sends the control signal EN OFF to the motor driving chip, the driving motor stops, and the movable housing 01 stops moving. In an ideal state, the sensing module 03 should report the sensing signal S when the movable housing 01 is positioned at the second position B, and the SOC main board sends the control signal EN OFF to the motor driving chip upon receiving the sensing signal S, and then the travel ends. However, since there may be a certain sensing error, the sensing module 03 may detect the sensing element on the movable housing 01 when the movable housing 01 does not reach the second position B, and report the sensing signal S, which results in an insufficient unrolling travel and a gap therebetween, affecting the user experience. When the sliding-rollable display device is rolling, the driving motor drives the movable housing 01 to move from the second position B to the first position A, the sensing module 03 at the first position A detects the sensing element 011, the SOC main board identifies the sensing signal S of the sensing module, and sends the control signal EN OFF to the motor driving chip, the driving motor is stopped, and the movable housing 01 stops moving. In an ideal state, the sensing module 03 should report the sensing signal S when the movable housing 01 is positioned at the first position A, the SOC main board sends the control signal EN OFF to the motor driving chip upon receiving the sensing signal S, and then the travel ends. However, since there may be a certain sensing error, the sensing module 03 may detect the sensing element of the movable housing 01 when the movable housing 01 does not reach the first position A, and report the sensing signal S, which results in an insufficient rolling travel in which the sliding-rollable display device cannot be fully rolled, affecting the user experience.

Embodiments of the present disclosure provide a driving method, an apparatus, and a sliding-rollable display device, which can improve the user experience of the sliding-rollable display device.

Figure 4:
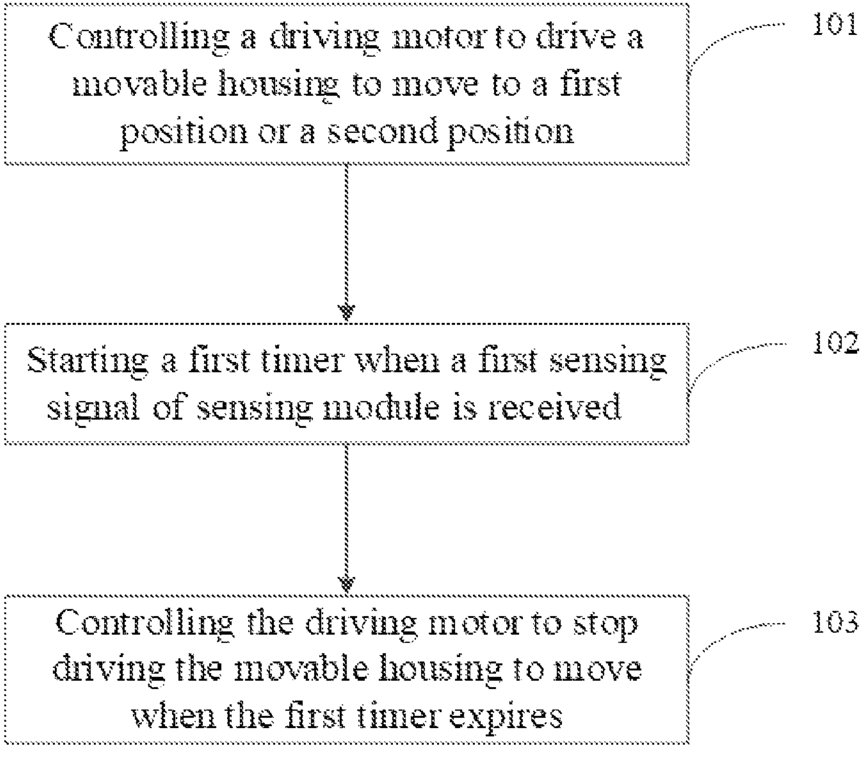
FIG. 4 is a schematic flowchart of a driving method according to an embodiment of the present disclosure.

Embodiments of the present disclosure provide a driving method, applied to a sliding-rollable display device. As shown in FIGS. 1 and 2, The sliding-rollable display device includes a movable housing 01, a driving motor and a flexible display screen 02, at least a portion of the flexible display screen 02 covers the movable housing 01, the driving motor is configured to drive the movable housing 01 to move between a first position A and a second position B. The first position A is a position where the movable housing 01 is located in a case that the sliding-rollable display device is fully rolled, the second position B is a position where the movable housing 01 is located in a case that the sliding-rollable display device is fully unrolled. A sensing element 011 is provided on the movable housing 01, and sensing modules 03 are provided at the first position A and the second position B, the sensing modules are configured for detecting the sensing element 011. As shown in FIG. 4, the driving method includes following steps.

Step 101: controlling the driving motor to drive the movable housing to move to the first position or the second position.

Step 102: starting a first timer when a first sensing signal from the sensing modules is received.

Step 103: controlling the driving motor to stop driving the movable housing to move when the first timer expires.

The first sensing signal indicates that the movable housing is located at a third position between the first position and the second position, and a duration of the first timer is determined by a first distance and a moving speed of the movable housing, where the first distance is a distance between the third position and the first position, or a distance between the third position and the second position.

In this embodiment, upon receiving the first sensing signal indicating that the movable housing is located at the third position X, the first timer is started. In response to an expiration of the first timer, the driving motor is controlled to stop driving the movable housing to move. By controlling the driving motor according to the duration of the first timer, the position of the movable housing can be accurately controlled, and thus a full unrolling and/or rolling travel of the sliding-rollable display device can be ensured, thereby improving the user experience of the sliding-rollable display device.

As shown in FIG. 2, the sensing module 03 may be a Hall element, the Hall elements of the same type may be arranged at the first position A and the second position B, respectively. The sensing element 011 may be a magnet and is provided on the movable housing 01. The Hall elements may sense the position of the sensing element 011. In order to ensure an accuracy and stability of the position X, the magnet is preferably central symmetric to ensure a homogeneity of the induced magnetic field around it.

In this embodiment, the third position X is located between the first position A and the second position B. This position a position which can be accurately identified by the modules. The third position X may be determined according to empirical values. The third position X in the unrolling travel and the third position X in the rolling travel may be different positions. The third position X in the unrolling travel may be closer to the second position B, while the third position X in the rolling travel may be closer to the first position A. After the third position X is determined, an intensity of the magnetic field of the sensing element 011 sensed by the sensing module 03 in a case that the movable housing is located at the third position X may be obtained in advance as a preset intensity. When the sensing module senses a magnetic field, an intensity of which is the preset intensity, the first sensing signal is reported, and the first timer is started.

When the movable housing is moving to the first position A or the second position B, both the sensing module 03 located at the first position A and the sensing module 03 located at the second position B may sense the sensing element 011, but the intensities of the magnetic field sensed by the sensing modules 03 differs according to the distance between the movable housing and the first position A, or the distance between the movable housing and the second position B. For example, during the rolling travel, the movable housing is moving towards the first position A, and the position of the movable housing may be sensed by using the sensing module 03 located at the first position A. As the distance between the movable housing and the first position A decreases, the intensity of the magnetic field sensed by the sensing module 03 located at the first position A becomes greater. When the movable housing reaches the third position X, the intensity of the magnetic field sensed by the sensing module 03 located at the first position A is the preset intensity, and the sensing module 03 located at the first position A reports the first sensing signal. During the unrolling travel, the movable housing is moving towards the second position B, and the position of the movable housing can be sensed by using the sensing module 03 located at the second position B. As the distance between the movable housing and the second position B decreases, the intensity of the magnetic field sensed by the sensing module 03 located at the second position B becomes greater. When the movable housing reaches the third position X, the intensity of the magnetic field sensed by the sensing module 03 located at the second position B is the preset intensity, and the sensing module 03 located at the second position B reports the first sensing signal.

The second distance between the first position A and the second position B, namely, a travel for sliding D, is fixed. After the position X is determined, a remaining travel distance L may be determined. For example, the driving motor is a direct-current motor having a uniform speed, the movable housing 01 moves at a uniform speed, and in the case where the position X for sensing is accurate, a time length required for the remaining travel distance, namely, the first duration T1, may be determined by T1=L/V, where V is the moving speed of the movable housing.

When the sliding-rollable display device is unrolling, the driving motor drives the movable housing 01 to move from the first position A to the second position B. When the sensing module 03 at the second position B detects the sensing element 011 and the intensity of the magnetic field of the sensing element 011 is the preset intensity, the first sensing signal is reported. The SOC main board identifies the first sensing signal from the sensing modules, and the first timer is started. A first duration of the first timer is determined by the remaining travel L and the moving speed V of the movable housing, and the remaining travel L is the distance between the third position X and the second position B. After the first timer expires (namely, the running time of the first timer exceeds the first duration of the first timer), the SOC main board sends the control signal EN OFF to the motor driving chip, the driving motor is stopped, and the movable housing 01 stops moving. When the sliding-rollable display device is rolling, the driving motor drives the movable housing 01 to move from the second position B to the first position A. When the sensing module 03 at the second position B detects the sensing element 011, and the intensity of the magnetic field of the sensing element 011 is the preset intensity, the first sensing signal is reported. The SOC main board identifies the first sensing signal from the sensing modules, and the first timer is started. A duration of the first timer is determined by the remaining travel L and the moving speed V of the movable housing, and the remaining travel is the distance between the third position X and the first position A. After the first timer times out (namely, the running time of the first timer exceeds the duration of the first timer), the SOC main board sends the control signal EN OFF to the motor driving chip, the driving motor is stopped, and the movable housing 01 stops moving.

In some extreme cases, the sensing module 03 may fail. In order to ensure safety and stability of the travel in such cases, to stop the driving motor in time, the method further includes:

obtaining a second duration for the movable housing to move from the first position to the second position;

starting a second timer when the driving motor drives the movable housing to move, a duration of the second timer being the second duration; and controlling the driving motor to stop driving the movable housing to move when the second timer expires.

In the present embodiment, the second duration is determined by a distance between the first position A and the second position B, and the moving speed of the movable housing. The second duration T2 is fixed in a case where both the distance between the first position A and the second position B, and the moving speed of the movable housing are fixed.

In some embodiments, the step of obtaining the second duration includes:

obtaining a second distance between the first position and the second position; and determining the second duration according to the second distance and the moving speed of the movable housing.

When the sliding-rollable display device is unrolling, the driving motor drives the movable housing 01 to move from the first position A to the second position B, and at the same time, the second timer is started. When the second timer expires, the SOC main board sends the control signal EN OFF to the motor driving chip, the driving motor is stopped, and the movable housing 01 stops moving. This enables the driving motor to be shut down in time to ensure a safe and stable travel, regardless of whether the sensing module fails or not.

When the sliding-rollable display device is rolling, the driving motor drives the movable housing 01 to move from the second position B to the first position A, and at the same time, the second timer is started. When the second timer expires, the SOC main board sends the control signal EN OFF to the motor driving chip, the driving motor is stopped, and the movable housing 01 stops moving. This enables the driving motor to be shut down in time to ensure a safe and stable travel, regardless of whether the sensing module fails or not.

Figure 5:
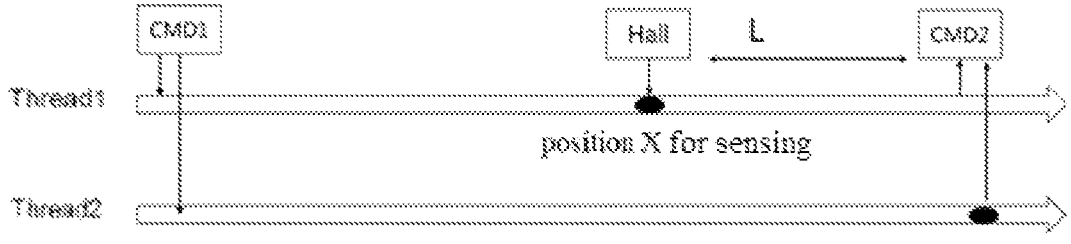
FIG. 5 is a schematic diagram of a first thread and a second thread according to an embodiment of the present disclosure.

Specifically, as shown in FIG. 5, a first thread Thread1 may be set in the SOC main board. When the sliding-rollable display device is unrolling or rolling, the SOC main board receives the first sensing signal from the sensing modules after sending an unrolling/rolling travel command CMD1 (namely, after sending the control signal EN to the motor driving chip, the driving motor is started). When the first sensing signal is detected, it can be known that a first stage of the travel is completed, and the movable housing reaches the third position X. The remaining travel is L, and a first duration T1=L/V is calculated by using the moving speed V of the movable housing. Namely, after detecting the first sensing signal, the Thread1 sets the first timer Timer1, and an expiration time of the Timer1 is the first duration T1. When the Timer1 expires, a motor stop command CMD2 is invoked (namely, after sending the control signal EN OFF to the motor driving chip, the driving motor is stopped), the driving motor is shut down, and the unrolling/rolling travel is completed.

In the SOC main board, a second thread Thread2 is set. When the sliding-rollable display device is unrolling or rolling, after the SOC main board sends an unrolling/rolling travel command CMD1 (namely, after sending the control signal EN to the motor driving chip, the driving motor is started), the second timer Timer2 is started, a duration of the Timer2 is the second duration T2. When the Timer2 expires, a motor stop command CMD2 is invoked (namely, after sending the control signal EN OFF to the motor driving chip, the driving motor is stopped), the driving motor is shut down, and the unrolling/rolling travel is completed.

In some embodiments, if the first timer is started, it is indicated that the sensing module is not failed and there is no need for continuing to the running of the second timer, because the safe and stable travel can be ensured regardless of whether the second timer is running or not, and the driving motor can be stopped in time. Therefore, if the second timer is started, the second timer may be stopped when the first timer expires. Alternatively, the second timer may be stopped when the first timer is started.

When the external environment, such as the ambient temperature, changes or an extreme situation occurs, the second duration T2 of the second timer and the moving speed V of the movable housing which are preset may change accordingly, thereby causing an error or mistake in the travel controlling. Therefore, in the present embodiment, a memory may be further provided for storing and recording a plurality of pieces of travel data in the unrolling/rolling travel of the sliding-rollable display device. The travel data and the temperature data according to the temperature data uploaded by a thermometer may be correlated, and the second duration T2 of the second timer and the moving speed V of the movable housing may be calibrated according to the recorded travel data and temperature data.

In some embodiments, the method further includes obtaining a moving speed of the movable housing, and this step further includes:

obtaining a plurality of groups of historical data, where each group of historical data includes an ambient temperature, a first time point and a second time point corresponding to the ambient temperature, the first time point is a time point when the driving motor starts to drive the movable housing to move, and the second time point is a time point when the first sensing signal from the sensing modules is received;

dividing, according to the ambient temperature, the plurality of groups of historical data into historical data sets corresponding to a plurality of different temperature ranges;

determining a standard moving speed for each historical data set, according to the first time point, the second time point and a first distance in groups of historical data within the historical data set, where the first distance is a distance between the third position and the first position or a distance between the third position and the second position; and obtaining a current ambient temperature, and determining a standard moving speed for a historical data set, which is corresponding to a temperature range to which the current ambient temperature belongs, as the moving speed of the movable housing.

In a specific example, in the travel of Thread1, a time point, when the SOC main board sends an unrolled/rolling travel command CMD1, is recorded as time0; a time point, when the sensing module senses the first sensing signal, is recorded as time1; and a time point, when the SOC main board issues a command CMD2 at the end of the travel, is recorded as time2. The time0, time1 and time2 forms a group of travel data, and associating it with current temperature data Temperature reported by the thermometer, then a travel record event EVENT is formed. When the execution of the CMD2 is completed, the event EVENT is stored in the memory SD. The manner for storing is not limited thereto.

A plurality of travel record events EVENT may be divided into a plurality of sets according to the temperature data Temperature, where the temperature data corresponding to the travel record events EVENT in each set are located in a certain temperature range. For example, 0 degree Celsius is taken as a reference and every 5 degrees Celsius is taken as a temperature range to obtain the plurality of sets, where temperature data corresponding to travel record events EVENT in a set 1 is greater than or equal to 0 degree Celsius and less than 5 degrees Celsius; temperature data corresponding to travel record events EVENT in a set 2 is greater than or equal to 5 degrees Celsius and less than 10 degrees Celsius; temperature data corresponding to travel record events EVENT in a set 3 is greater than or equal to 10 degrees Celsius and less than 15 degrees Celsius; temperature data corresponding to travel record events EVENT in a set 4 is greater than or equal to 15 degrees Celsius and less than 20 degrees Celsius, and so on. After a long time of recording, there may be a large quantity of travel record events EVENT in each set, and the travel record events EVENT in each set can be limited to a certain quantity of latest travel record events EVENT, to ensure the timeliness of the travel record events EVENT. For example, each set includes the latest 500 travel record events EVENT.

Each travel record event EVENT contains time0, time1 and time2, and a time duration of time1-time0 is recorded as Th. Since the position of X is relatively fixed, the moving speed V of the movable housing may be calculated by a distance between X and A or a distance between X and B divided by Th. N pieces of moving speeds V may be calculated with N travel record events EVENT in the set. Pieces of moving speeds V deviating from an average level are discarded, and an average speed Vave is calculated by using all the remaining V values. In this way, average values Vave corresponding to multiple sets may be obtained. A current ambient temperature may be obtained, and a temperature range corresponding to the current ambient temperature may be obtained, a set corresponding to the determined temperature range may be determined, and a value Vave corresponding to the determined set may be assigned to the moving speed V of the movable housing.

In some embodiments, the step of obtaining the second duration includes:

obtaining a plurality of groups of historical data, where each group of historical data includes an ambient temperature, a first time point and a third time point corresponding to the ambient temperature, where the first time point is a time point when the driving motor starts to drive the movable housing to move, and the third time point is a time point when the driving motor stops driving the movable housing to move;

dividing, according to the ambient temperature, the plurality of groups of historical data into historical data sets corresponding to a plurality of different temperature ranges;

determining a standard second duration for each historical data set, according to the first time point and the third time point in groups of historical data included in the historical data set; and obtaining a current ambient temperature, and determining a standard second duration for a historical data set, which is corresponding to a temperature range to which the current ambient temperature belongs, as the second duration.

Each travel record event EVENT contains time0, time1 and time2. A running time duration Tall for the whole travel may be obtained through time2-time0. N pieces of Tall may be calculated through N travel record events EVENT in the set. Pieces of Tall deviating from an average level are discarded, and an average value Tave is calculated by using all the remaining Tall values. In this way, average values Tave corresponding to multiple sets may be obtained. A current ambient temperature is obtained, a temperature range corresponding to the current ambient temperature is determined, a set corresponding to the determined temperature range is determined, and a value Tave corresponding to the determined set is assigned to T2 of the thread Thread2.

In this embodiment, a large amount of data is collected for statistics, a standard data value may be obtained through an algorithm, and the moving speed V of the movable housing and the second duration T2 may be obtained by using the standard data value, so that the travel can be controlled more accurately.

Figures 6, 7:
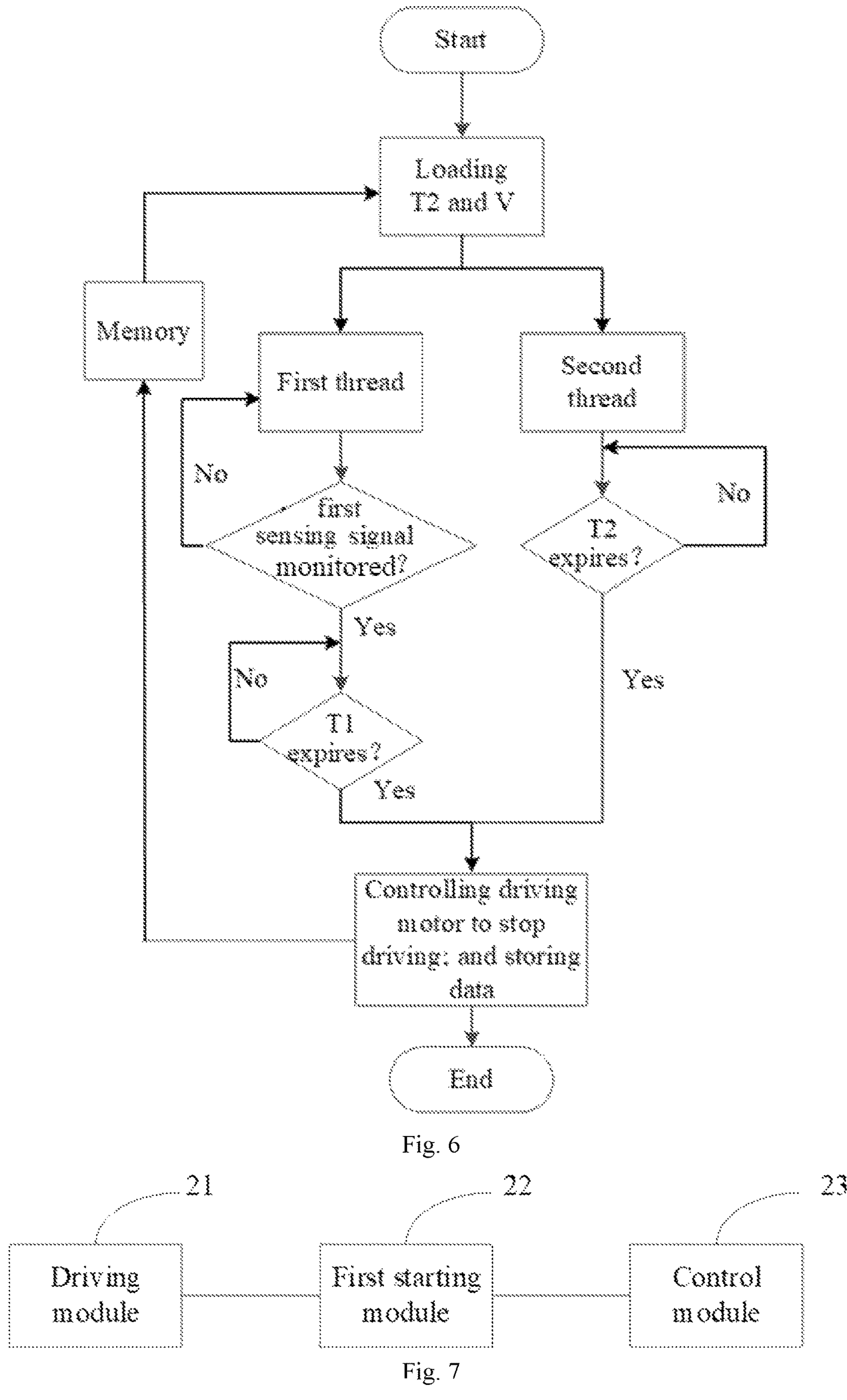
FIG. 6 is a flow chart illustrating travel controlling according to an embodiment of the present disclosure.
FIG. 7 is a schematic flowchart of a driving method according to an embodiment of the present disclosure.

In a specific example, as shown in FIG. 6, the travel is controlled by the following steps:

obtaining a current ambient temperature, determining a temperature range corresponding to the current ambient temperature, determining a set corresponding to the determined temperature range, assigning a value Tave corresponding to the determined set to T2 of the second thread, and assigning a value Vave corresponding to the determined set to the moving speed V of the movable housing;

starting the first thread and the second thread;

in the first thread, determining whether the first sensing signal is received, and in accordance with a positive determination, starting the first timer; determining whether a duration T1 of the first timer expires, and in accordance with a positive determination, controlling the driving motor to stop driving, and storing the travel record event EVENT of this travel; and in the second thread, starting the second timer, determining whether a duration T2 of the second timer expires, and in accordance with a positive determination, controlling the driving motor to stop driving, and storing the travel record event EVENT of this travel.

Embodiments of the present disclosure further provide a driving apparatus. As shown in FIGS. 1 and 2. A sliding-rollable display device includes a movable housing 01, a driving motor and a flexible display screen 02, where at least a portion of the flexible display screen 02 covers the movable housing 01, and the driving motor is configured to drive the movable housing 01 to move between a first position A and a second position B. The first position A is a position of the movable housing 01 when the sliding-rollable display device is fully rolled, and the second position B is a position of the movable housing 01 when the sliding-rollable display device is fully unrolled. A sensing element 011 is disposed on the movable housing 01, and sensing modules 03 for the first position A and the second position B are provided, for detecting the sensing element 011. As shown in FIG. 7, the driving apparatus includes:

a driving module 21, configured to control the driving motor to drive the movable housing to move to the first position or the second position;

a first starting module 22, configured to start a first timer when a first sensing signal from the sensing modules is received; and a control module 23, configured to control the driving motor to stop driving the movable housing to move when the first timer expires.

The first sensing signal indicates that the movable housing is located at a third position between the first position and the second position, and a duration of the first timer is determined by a first distance and a moving speed of the movable housing, where the first distance is a distance between the third position and the first position, or a distance between the third position and the second position.

In this embodiment, upon receiving the first sensing signal indicating that the movable housing is located at the third position X, the first timer is started. In response to an expiration of the first timer, the driving motor is controlled to stop driving the movable housing to move. By controlling the driving motor according to the duration of the first timer, the position of the movable housing can be accurately controlled, and thus a full unrolling and/or rolling travel of the sliding-rollable display device can be ensured, thereby improving the user experience of the sliding-rollable display device.

The driving module 21, the first starting module 22 and the control module 23 are located in the SOC main board. As shown in FIG. 2, the sensing module 03 may be a Hall element, the same Hall elements may be arranged at the first position A and the second position B, respectively. The sensing element 011 may be a magnet and is provided on the movable housing 01. The Hall elements may sense the position of the sensing element 011. In order to ensure an accuracy and stability of the position X, the magnet is preferably central symmetric to ensure a homogeneity of the induced magnetic field around it.

In this embodiment, the third position X is located between the first position A and the second position B. This position a position which can be accurately identified by the modules. The third position X may be determined according to empirical values. The third position X in the unrolling travel and the third position X in the rolling travel may be different positions. The third position X in the unrolling travel may be closer to the second position B, while the third position X in the rolling travel may be closer to the first position A. After the third position X is determined, an intensity of the magnetic field of the sensing element 011 sensed by the sensing module 03 in a case that the movable housing is located at the third position X may be obtained in advance, and the obtained intensity may be determined as a preset intensity. When the sensing module senses a magnetic field, an intensity of which is the preset intensity, the first sensing signal is reported, and the first timer is started.

When the movable housing is moving to the first position A or the second position B, both the sensing module 03 located at the first position A and the sensing module 03 located at the second position B may sense the sensing element 011, but the intensities of the magnetic field sensed by the sensing modules 03 differs according to the distance between the movable housing and the first position A, or the distance between the movable housing and the second position B. For example, during the rolling travel, the movable housing is moving towards the first position A, and the position of the movable housing may be sensed by using the sensing module 03 located at the first position A. As the distance between the movable housing and the first position A decreases, the intensity of the magnetic field sensed by the sensing module 03 located at the first position A becomes greater. When the movable housing reaches the third position X, the intensity of the magnetic field sensed by the sensing module 03 located at the first position A is the preset intensity, and the sensing module 03 located at the first position A reports the first sensing signal. During the unrolling travel, the movable housing is moving towards the second position B, and the position of the movable housing can be sensed by using the sensing module 03 located at the second position B. As the distance between the movable housing and the second position B decreases, the intensity of the magnetic field sensed by the sensing module 03 located at the second position B becomes greater. When the movable housing reaches the third position X, the intensity of the magnetic field sensed by the sensing module 03 located at the second position B is the preset intensity, and the sensing module 03 located at the second position B reports the first sensing signal.

The second distance between the first position A and the second position B, namely, a travel for sliding D, is fixed. After the position X is determined, a remaining travel distance L may be determined. For example, the driving motor is a direct-current motor having a uniform speed, the movable housing 01 moves at a uniform speed, and in the case where the position X for sensing is accurate, a time length required for the remaining travel distance, namely, the first duration T1, may be determined by T1=L/V, where V is the moving speed of the movable housing.

When the sliding-rollable display device is unrolling, the driving motor drives the movable housing 01 to move from the first position A to the second position B. When the sensing module 03 at the second position B detects the sensing element 011 and the intensity of the magnetic field of the sensing element 011 is the preset intensity, the first sensing signal is reported. The first starting module 22 identifies the first sensing signal from the sensing modules, and starts the first timer. A first duration of the first timer is determined by the remaining travel L and the moving speed V of the movable housing, and the remaining travel L is the distance between the third position X and the second position B. When the first timer expires (namely, the running time of the first timer exceeds the first duration of the first timer), the control module 23 sends a control signal EN OFF to a motor driving chip, the driving motor is stopped, and the movable housing 01 stops moving. When the sliding-rollable display device is rolling, the driving motor drives the movable housing 01 to move from the second position B to the first position A. When the sensing module 03 at the second position B detects the sensing element 011, and the intensity of the magnetic field of the sensing element 011 is the preset intensity, the first sensing signal is reported. The first starting module 22 identifies the first sensing signal from the sensing modules, and starts the first timer. A duration of the first timer is determined by the remaining travel L and the moving speed V of the movable housing, and the remaining travel is the distance between the third position X and the first position A. When the first timer expires (namely, the running time of the first timer exceeds the duration of the first timer), the control module 23 sends the control signal EN OFF to the motor driving chip, the driving motor is stopped, and the movable housing 01 stops moving.

In some extreme cases, the sensing module 03 may fail. In order to ensure safety and stability of the travel in such cases, to stop the driving motor in time, the apparatus further includes:

an obtaining module, configured to obtain a second duration for the movable housing to move from the first position to the second position; and a second starting module, configured to start a second timer when the driving motor drives the movable housing to move, a duration of the second timer being the second duration;

the control module being further configured to control the driving motor to stop driving the movable housing to move when the second timer expires.

The obtaining module and the second starting module are located in the SOC main board.

In the present embodiment, the second duration is determined by a distance between the first position A and the second position B, and the moving speed of the movable housing. The second duration T2 is fixed in a case where both the distance between the first position A and the second position B, and the moving speed of the movable housing are fixed.

In some embodiments, the obtaining module includes:

a second obtaining unit, configured to obtain a second distance between the first position and the second position; and a second determination unit, configured to determine the second duration according to the second distance and the moving speed of the movable housing.

When the sliding-rollable display device is unrolling, the driving motor drives the movable housing 01 to move from the first position A to the second position B, and at the same time, the second timer is started. When the second timer expires, the control module 23 sends the control signal EN OFF to the motor driving chip, the driving motor is stopped, and the movable housing 01 stops moving. This enables the driving motor to be shut down in time to ensure a safe and stable travel, regardless of whether the sensing module fails or not.

When the sliding-rollable display device is rolling, the driving motor drives the movable housing 01 to move from the second position B to the first position A, and at the same time, the second timer is started. When the second timer expires, the control module 23 sends the control signal EN OFF to the motor driving chip, the driving motor is stopped, and the movable housing 01 stops moving. This enables the driving motor to be shut down in time to ensure a safe and stable travel, regardless of whether the sensing module fails or not.

In some embodiments, the apparatus further includes:

a stopping module, configured to stop the second timer when the first timer expires.

The stopping module is located on the SOC main board. If the first timer is started, it is indicated that the sensing module is not failed and there is no need for continuing to the running of the second timer, because the safe and stable travel can be ensured regardless of whether the second timer is running or not, and the driving motor can be stopped in time. Therefore, if the second timer is started, the second timer may be stopped when the first timer expires. Alternatively, the second timer may be stopped when the first timer is started.

When the external environment, such as the ambient temperature, changes or an extreme situation occurs, the second duration T2 of the second timer and the moving speed V of the movable housing which are preset may change accordingly, thereby causing an error or mistake in the travel controlling. Therefore, in the present embodiment, a memory may be further provided for storing and recording a plurality of pieces of travel data in the unrolling/rolling travel of the sliding-rollable display device. The travel data and the temperature data according to the temperature data uploaded by a thermometer may be correlated, and the second duration T2 of the second timer and the moving speed V of the movable housing may be calibrated according to the recorded travel data and temperature data.

In some embodiments, the apparatus further includes:

a moving speed obtaining module, configured to obtain a moving speed of the movable housing. The moving speed obtaining module includes:

a first obtaining unit, configured to obtain a plurality of groups of historical data, where each group of historical data includes an ambient temperature, a first time point and a second time point corresponding to the ambient temperature, the first time point is a time point when the driving motor starts to drive the movable housing to move, and the second time point is a time point when the first sensing signal from the sensing modules is received;

a first dividing unit, configured to divide the plurality of groups of historical data into historical data sets corresponding to a plurality of different temperature ranges according to the ambient temperature;

a first determination unit, configured to determine a standard moving speed for each historical data set, according to the first time point, the second time point and the first distance in groups of historical data within the historical data set, wherein the first distance is a distance between the third position and the first position, or a distance between the third position and the second position; and a first processing unit, configured to obtain a current ambient temperature, and determine a standard moving speed for a historical data set, which is corresponding to a temperature range to which the current ambient temperature belongs, as the moving speed of the movable housing.

The moving speed obtaining module is located in the SOC main board.

In a specific example, in the travel of Thread1, a time point, when an unrolled/rolling travel command CMD1 is sent by the control module 23, is recorded as time0; a time point, when the first sensing signal is sensed by the sensing module, is recorded as time1; and a time point, when a command CMD2 issued by the control module 23 at the end of the travel, is recorded as time2. The time0, time1 and time2 forms a group of travel data, and associating it with current temperature data Temperature reported by the thermometer, then a travel record event EVENT is formed. When the execution of the CMD2 is completed, the event EVENT is stored in the memory SD. The manner for storing is not limited thereto.

A plurality of travel record events EVENT may be divided into a plurality of sets according to the temperature data Temperature, where the temperature data corresponding to the travel record events EVENT in each set are located in a certain temperature range. For example, 0 degree Celsius is taken as a reference and every 5 degrees Celsius is taken as a temperature range to obtain the plurality of sets, where temperature data corresponding to travel record events EVENT in a set 1 is greater than or equal to 0 degree Celsius and less than 5 degrees Celsius; temperature data corresponding to travel record events EVENT in a set 2 is greater than or equal to 5 degrees Celsius and less than 10 degrees Celsius; temperature data corresponding to travel record events EVENT in a set 3 is greater than or equal to 10 degrees Celsius and less than 15 degrees Celsius; temperature data corresponding to travel record events EVENT in a set 4 is greater than or equal to 15 degrees Celsius and less than 20 degrees Celsius, and so on. After a long time of recording, there may be a large quantity of travel record events EVENT in each set, and the travel record events EVENT in each set can be limited to a certain quantity of latest travel record events EVENT, to ensure the timeliness of the travel record events EVENT. For example, each set includes the latest 500 travel record events EVENT.

Each travel record event EVENT contains time0, time1 and time2, and a time duration of time1-time0 is recorded as Th. Since the position of X is relatively fixed, the moving speed V of the movable housing may be calculated by a distance between X and A or a distance between X and B divided by Th. N pieces of moving speeds V may be calculated with N travel record events EVENT in the set. Pieces of moving speeds V deviating from an average level are discarded, and an average speed Vave is calculated by using all the remaining V values. In this way, average values Vave corresponding to multiple sets may be obtained. A current ambient temperature may be obtained, and a temperature range corresponding to the current ambient temperature may be obtained, a set corresponding to the determined temperature range may be determined, and a value Vave corresponding to the determined set may be assigned to the moving speed V of the movable housing.

In some embodiments, the obtaining module includes:

- a third obtaining unit, configured to obtain a plurality of groups of historical data, where each group of historical data includes an ambient temperature, a first time point and a third time point corresponding to the ambient temperature, where the first time point is a time point when the driving motor starts to drive the movable housing to move, and the third time point is a time point when the driving motor stops driving the movable housing to move;
- a second dividing unit, configured to divide the plurality of groups of historical data into historical data sets corresponding to a plurality of different temperature ranges according to the ambient temperature;
- a third determination unit, configured to determine a standard moving speed for each historical data set, according to the first time point and the third time point in groups of historical data included in the historical data set; and
- a second processing unit, configured to obtain a current ambient temperature, and determine a standard second duration for a historical data set, which is corresponding to a temperature range to which the current ambient temperature belongs, as the second duration.

Each travel record event EVENT contains time0, time1 and time2. A running time duration Tall for the whole travel may be obtained through time2-time0. N pieces of Tall may be calculated through N travel record events EVENT in the set. Pieces of Tall deviating from an average level are discarded, and an average value Tave is calculated by using all the remaining Tall values. In this way, average values Tave corresponding to multiple sets may be obtained. A current ambient temperature is obtained, a temperature range corresponding to the current ambient temperature is determined, a set corresponding to the determined temperature range is determined, and a value Tave corresponding to the determined set is assigned to T2 of the thread Thread2.

In this embodiment, a large amount of data is collected for statistics, a standard data value may be obtained through an algorithm, and the moving speed V of the movable housing and the second duration T2 may be obtained by using the standard data value, so that the travel can be controlled more accurately.

Embodiments of the present disclosure further provide a sliding-rollable display device. As shown in FIGS. 1 and 2, the sliding-rollable display device includes a movable housing 01, a driving motor and a flexible display screen 02, at least a portion of the flexible display screen 02 covers the movable housing 01, the driving motor is configured to drive the movable housing 01 to move between a first position A and a second position B. The first position A is a position of the movable housing 01 when the sliding-rollable display device is fully rolled, the second position B is a position of the movable housing 01 when the sliding-rollable display device is fully unrolled. A sensing element 011 is arranged on the movable housing 01. Sensing modules 03 are arranged for the first position A and the second position B, which are configured for detecting the sensing element 011. The sliding-rollable display device further includes the driving apparatus as described above.

As shown in FIG. 2, the sensing module 03 may adopt a Hall element, the same Hall elements may be arranged at the first position A and the second position B, and the sensing element 011 may adopt a magnet, and the sensing element 011 is provided on the movable housing 01. The Hall element may sense the position of the sensing element 011. In order to ensure accuracy and stability of the position X, the magnet is preferably centrosymmetric to ensure homogeneity of the induced magnetic field around it.

The sliding-rollable display device includes: a radio frequency unit, a network module, an audio output unit, an input unit, a sensor, a display unit, a user input unit, an interface unit, a memory, a processor, and a power supply, but the present disclosure is not limited thereto. It will be appreciated by those skilled in the art that the configuration of the display device described above is not intended to be limiting and that the display device may include more or fewer of the components described above, or some combinations of the components, or different arrangements of the components. In embodiments of the present disclosure, the display device includes, but is not limited to, a display, a cell phone, a tablet, a television, a wearable electronic device, a navigation display apparatus, etc.

The sliding-rollable display device may be any product or component with a display function, such as a television, a display, a digital photo frame, a mobile phone, a tablet computer, where the display device further includes a flexible circuit board, a printed circuit board and a back panel.

In the various method embodiments of the present disclosure, the serial number of each step are not be used to define the order of each step, and for a person of ordinary skill in the art, changes in the order of each step without involving any inventive effort are also within the scope of the present disclosure.

It should be noted that the various embodiments described herein are described in a progressive manner with reference to the same or similar parts throughout the various embodiments, with each embodiment focusing on differences from the other embodiments. In particular, the method embodiments are described more simply because they are substantially similar to the product embodiments, details of which can be refer to the description of the product embodiments.

Unless defined otherwise, technical or scientific terms used in this disclosure shall have the ordinary meaning as understood by one of ordinary skill in the art to which this disclosure belongs. The terms "first", "second", and the like as use herein do not denote any order, quantity, or importance, but rather are used to distinguish one element from another. The terms "include" or "comprise", and the like, means that the presence of an element or item preceding the word covers the presence of the element or item listed after the word and equivalents thereof, but does not exclude other elements or items. The terms "connect" or "couple" and the like are not limited to physical or mechanical connections, but may include electrical connections, whether direct or indirect. The terms "upper", "lower", "left", "right" and the like are used only to indicate relative positional relationships that may change accordingly when the absolute position of the object being described changes.

It will be understood that when an element such as a layer, film, region or substrate is referred to as being "on" or "under" another element, it can be "directly on" or "directly under" the other element or intervening elements may be present.

In the description of the embodiments above, particular features, structures, materials, or characteristics may be combined in any suitable manner in any one or more embodiments or examples.

While the present disclosure has been described with reference to specific embodiments, it will be understood by those skilled in the art that various changes may be made and equivalents may be substituted for elements thereof without departing from the scope of the disclosure. Accordingly, the protection scope is set forth in the claims.

What is claimed is:

1. A driving method, applied to a sliding-rollable display device, wherein the sliding-rollable display device comprises a movable housing, a driving motor, and a flexible display screen, at least a portion of the flexible display screen covers the movable housing, the driving motor is configured to drive the movable housing to move between a first position and a second position, wherein the first position is a position of the movable housing when the sliding-rollable display device is fully rolled, and the second position is a position of the movable housing when the sliding-rollable display device is fully unrolled; a sensing element is provided on the movable housing, and sensing circuits are provided at the first position and the second position for detecting the sensing element; wherein the driving method comprises:

controlling the driving motor to drive the movable housing to move to the first position or the second position;

starting a first timer when a first sensing signal from the sensing circuits is received; and controlling the driving motor to stop driving the movable housing to move when the first timer expires;

wherein the first sensed signal indicates that the movable housing is located at a third position between the first position and the second position, a duration of the first timer is determined by a first distance and a moving speed of the movable housing, the first distance is a distance between the third position and the first position, or a distance between the third position and the second position.

2. The driving method according to claim 1, further comprising:

obtaining a second duration for the movable housing to move from the first position to the second position;

starting a second timer after the driving motor drives the movable housing to move, wherein a duration of the second timer is the second duration; and controlling the driving motor to stop driving the movable housing to move when the second timer expires.

3. The driving method according to claim 2, further comprising:

stopping the second timer when the first timer expires.

4. The driving method according to claim 1, further comprising:

obtaining a moving speed of the movable housing, comprising:

obtaining a plurality of groups of historical data, each of the plurality of groups of historical data comprising an ambient temperature, a first time point and a second time point which are corresponding to the ambient temperature, wherein the first time point is a time point when the driving motor starts to drive the movable housing to move, and the second time point is a time point when the first sensing signal from the sensing circuits is received;

dividing, according to the ambient temperature, the plurality of groups of historical data into historical data sets corresponding to a plurality of different temperature ranges;

determining a standard moving speed for each of the historical data sets, according to the first time point, the second time point and a first distance in groups of historical data included in the historical data set, wherein the first distance is a distance between the third position and the first position, or a distance between the third position and the second position; and obtaining a current ambient temperature, and determining a standard moving speed for a historical data set, which is corresponding to a temperature range within which the current ambient temperature is located, as the moving speed of the movable housing.

5. The driving method according to claim 2, wherein obtaining the second duration comprises:

obtaining a second distance between the first position and the second position; and determining the second duration according to the second distance and a moving speed of the movable housing.

6. The driving method according to claim 2, wherein obtaining the second duration comprises:

obtaining a plurality of groups of historical data, each of the plurality of groups of historical data comprising an ambient temperature, a first time point and a third time point which are corresponding to the ambient temperature, wherein the first time point is a time point when the driving motor starts to drive the movable housing to move, and the third time point is a time point when the driving motor stops driving the movable housing to move;

dividing, according to the ambient temperature, the plurality of groups of historical data into historical data sets corresponding to a plurality of different temperature ranges;

determining a standard second duration for each of the historical data sets, according to the first time point and the third time point in groups of historical data included in the historical data set; and obtaining a current ambient temperature, and determining a standard second duration for a historical data set, which is corresponding to a temperature range within which the current ambient temperature is located, as the second duration.

7. A driving apparatus, applied to a sliding-rollable display device, wherein the sliding-rollable display device comprises a movable housing, a driving motor, and a flexible display screen, at least a portion of the flexible display screen covers the movable housing, the driving motor is configured to drive the movable housing to move between a first position and a second position, wherein the first position is a position of the movable housing when the sliding-rollable display device is fully rolled, and the second position is a position of the movable housing when the sliding-rollable display device is fully unrolled; a sensing element is provided on the movable housing, and sensing circuits are provided at the first position and the second position for detecting the sensing element; wherein the driving apparatus comprises:

a driving circuit, configured to control the driving motor to drive the movable housing to move to the first position or the second position;

a first starting circuit, configured to start a first timer when a first sensing signal from the sensing circuits is received; and a control circuit, configured to control the driving motor to stop driving the movable housing to move when the first timer expires;

wherein the first sensing signal indicates that the movable housing is located at a third position between the first position and the second position, a duration of the first timer is determined by a first distance and a moving speed of the movable housing, the first distance is a distance between the third position and the first position, or a distance between the third position and the second position.

8. The driving apparatus according to claim 7, further comprising:

an obtaining circuit, configured to obtain a second duration for the movable housing to move from the first position to the second position; and a second starting circuit, configured to start a second timer when the driving motor drives the movable housing to move, wherein a duration of the second timer is the second duration;

wherein the control circuit is further configured to control the driving motor to stop driving the movable housing to move when the second timer expires.

9. The driving apparatus according to claim 8, further comprising:

a stopping circuit, configured to stop the second timer when the first timer expires.

10. The driving apparatus according to claim 7, further comprising:

a moving speed obtaining circuit, configured to obtain a moving speed of the movable housing, comprising:

a first obtaining sub-circuit, configured to obtain a plurality of groups of historical data, each of the plurality of groups of historical data comprising an ambient temperature, a first time point and a second time point which are corresponding to the ambient temperature, wherein the first time point is a time point when the driving motor starts to drive the movable housing to move, and the second time point is a time point when the first sensing signal from the sensing circuits is received;

a first dividing sub-circuit, configured to divide, according to the ambient temperature, the plurality of groups of historical data into historical data sets corresponding to a plurality of different temperature ranges;

a first determination sub-circuit, configured to determine a standard moving speed for each of the historical data sets, according to the first time point, the second time point and the first distance in groups of historical data included in the historical data set, wherein the first distance is the distance between the third position and the first position, or the distance between the third position and the second position; and a first processing sub-circuit, configured to obtain a current ambient temperature, and determine a standard moving speed for a historical data set, which is corresponding to a temperature range with which the current ambient temperature is located, as the moving speed of the movable housing.

11. The driving apparatus according to claim 8, wherein the obtaining circuit comprises:

a second obtaining sub-circuit, configured to obtain a second distance between the first position and the second position; and a second determination sub-circuit, configured to determine the second duration according to the second distance and a moving speed of the movable housing.

12. The driving apparatus according to claim 8, wherein the obtaining circuit comprises:

a third obtaining sub-circuit, configured to obtain a plurality of groups of historical data, each of the plurality of groups of the historical data comprising an ambient temperature, a first time point and a third time point which are corresponding to the ambient temperature, wherein the first time point is a time point when the driving motor starts to drive the movable housing to move, and the third time point is a time point when the driving motor stops driving the movable housing to move;

a second dividing sub-circuit, configured to divide, according to the ambient temperature, the plurality of groups of historical data into historical data sets corresponding to a plurality of different temperature ranges;

a third determination sub-circuit, configured to determine a standard second duration, for each of the historical data sets, according to the first time point and the third time point in groups of historical data included in the historical data set; and a second processing sub-circuit, configured to obtain a current ambient temperature, and determine a standard second duration for a historical data set, which is corresponding to a temperature range within which the current ambient temperature is located, as the second duration.

13. A sliding-rollable display device, comprising a movable housing, a driving motor, and a flexible display screen, wherein at least a portion of the flexible display screen covers the movable housing, the driving motor is configured to drive the movable housing to move between a first position and a second position, wherein the first position is a position of the movable housing when the sliding-rollable display device is fully rolled, and the second position is a position of the movable housing when the sliding-rollable display device is fully unrolled; a sensing element is provided on the movable housing, and sensing circuits are provided at the first position and the second position for detecting the sensing element; wherein the sliding-rollable display device further comprises an driving apparatus, and the driving apparatus comprises:

a driving circuit, configured to control the driving motor to drive the movable housing to move to the first position or the second position:

a first starting circuit, configured to start a first timer when a first sensing signal from the sensing circuits is received; and a control circuit, configured to control the driving motor to stop driving the movable housing to move when the first timer expires;

wherein the first sensing signal indicates that the movable housing is located at a third position between the first position and the second position, a duration of the first timer is determined by a first distance and a moving speed of the movable housing, the first distance is a distance between the third position and the first position, or a distance between the third position and the second position.

14. The sliding-rollable display device according to claim 13, wherein the sensing element is a magnet.

15. The sliding-rollable display device according to claim 14, wherein the magnet has a central symmetric structure.

16. The sliding-rollable display device according to claim 13, wherein the driving apparatus further comprises:

an obtaining circuit, configured to obtain a second duration for the movable housing to move from the first position to the second position; and a second starting circuit, configured to start a second timer when the driving motor drives the movable housing to move, wherein a duration of the second timer is the second duration;

wherein the control circuit is further configured to control the driving motor to stop driving the movable housing to move when the second timer expires.

17. The sliding-rollable display device according to claim 16, wherein the driving apparatus further comprises:

a stopping circuit, configured to stop the second timer when the first timer expires.

18. The sliding-rollable display device according to claim 13, wherein the driving apparatus further comprises:

a moving speed obtaining circuit, configured to obtain a moving speed of the movable housing;

wherein the moving speed obtaining circuit comprises:

a first obtaining sub-circuit, configured to obtain a plurality of groups of historical data, each of the plurality of groups of historical data comprising an ambient temperature, a first time point and a second time point which are corresponding to the ambient temperature, wherein the first time point is a time point when the driving motor starts to drive the movable housing to move, and the second time point is a time point when the first sensing signal from the sensing circuits is received;

a first dividing sub-circuit, configured to divide, according to the ambient temperature, the plurality of groups of historical data into historical data sets corresponding to a plurality of different temperature ranges;

a first determination sub-circuit, configured to determine a standard moving speed for each of the historical data sets, according to the first time point, the second time point and the first distance in groups of historical data included in the historical data set, wherein the first distance is the distance between the third position and the first position, or the distance between the third position and the second position; and a first processing sub-circuit, configured to obtain a current ambient temperature, and determine a standard moving speed for a historical data set, which is corresponding to a temperature range with which the current ambient temperature is located, as the moving speed of the movable housing.

19. The sliding-rollable display device according to claim 16, wherein the obtaining circuit comprises:

a second obtaining sub-circuit, configured to obtain a second distance between the first position and the second position; and a second determination sub-circuit, configured to determine the second duration according to the second distance and a moving speed of the movable housing.

20. The sliding-rollable display device according to claim 16, wherein the obtaining circuit comprises:

a third obtaining sub-circuit, configured to obtain a plurality of groups of historical data, each of the plurality of groups of the historical data comprising an ambient temperature, a first time point and a third time point which are corresponding to the ambient temperature, wherein the first time point is a time point when the driving motor starts to drive the movable housing to move, and the third time point is a time point when the driving motor stops driving the movable housing to move;

a second dividing sub-circuit, configured to divide, according to the ambient temperature, the plurality of groups of historical data into historical data sets corresponding to a plurality of different temperature ranges;

a third determination sub-circuit, configured to determine a standard second duration, for each of the historical data sets, according to the first time point and the third time point in groups of historical data included in the historical data set; and a second processing sub-circuit, configured to obtain a current ambient temperature, and determine a standard second duration for a historical data set, which is corresponding to a temperature range within which the current ambient temperature is located, as the second duration.

* * * * *